United States Patent [19]

Bopp

[11] 4,329,420
[45] May 11, 1982

[54] PROCESS OF PREPARING PRE-PRESS PROOFS USING PRESSURE SENSITIVE ADHESIVE BACKINGS

[76] Inventor: Ferdinand L. Bopp, 450 Wicksworth La., St. Louis, Mo. 63122

[21] Appl. No.: 185,983

[22] Filed: Sep. 10, 1980

[51] Int. Cl.³ .............................................. G03F 1/00
[52] U.S. Cl. .................................. 430/293; 430/291; 430/358; 430/961; 430/18
[58] Field of Search .............. 430/291, 293, 358, 961, 430/18

[56] References Cited

U.S. PATENT DOCUMENTS

| | | | |
|---|---|---|---|
| 3,649,268 | 3/1972 | Chu et al. | 430/293 |
| 3,798,034 | 3/1974 | Lariden | 430/293 |
| 3,811,882 | 5/1974 | Henry | 430/293 |
| 4,053,313 | 10/1977 | Fan | 430/291 |

*Primary Examiner*—Jack P. Brammer
*Attorney, Agent, or Firm*—Gravely, Lieder & Woodruff

[57] ABSTRACT

This disclosure relates to a method of protecting pre-press and pre-plate proofs in a non-costly manner by applying a cover sheet of hard thin clear plastic having a pressure sensitive backing. The cover sheet can be polyester, polyethylene, Mylar, etc.

7 Claims, 2 Drawing Figures

PROCESS OF PREPARING PRE-PRESS PROOFS USING PRESSURE SENSITIVE ADHESIVE BACKINGS

BACKGROUND OF THE INVENTION

This invention relates to the field of pre-press proofs and in particular relates to a method of protecting the surfaces of such proofs by applying a thin clear hard plastic overlay thereto by means of a pressure sensitive adhesive adhered to the back surface of the overlay.

Presently there are two commercially accepted methods of making pre-press or pre-plate proofs. These are the CROMALIN system of DuPont and the TRANSFER-KEY system of 3M Company. These are used by color separation houses which make separate positives or negatives for each color in a four-color printing process for delivery to the printer. These also are used by publishers, platemakers, pressman, and, of course, by customers who can see a full color proof without the expense by making plates and press runs.

In the DuPont process, a film consisting of a photopolymer sandwiched between cover and base sheets is used. The base sheet is removed and the photopolymer and cover sheet are laminated to a sheet of proof stock.

A separation halftone film of the appropriate color is registered to the proof sheet and the sensitized proof sheet is exposed through the film in an ultraviolet-rich source.

The light sensitive photopolymer layer of the film is colorless and tacky as manufactured. The halftone image of the separation positive permits the exposure to selectively harden the non-image areas of the photopolymer. These exposure-hardened areas lose their tacky characteristic so the film accepts the color toner only in the unexposed image areas.

The exposed laminate is placed on a toning console, the cover sheet is peeled off, and the first dry color toner is applied.

A separate acrylic applicator is used for each color toner. The tacky photopolymer accepts toner reproducibly with a standardized toning pattern and procedure. The toning console is equipped with a suction downdraft around the toning platform to keep color toner dust out of the air.

The process is repeated: laminate, register, expose, and tone, for each separation film. After all of the images have been toned—yellow, magenta, cyan, and black—another layer is laminated to the proof and given an all-over exposure to harden it.

This final coating is very expensive as the photosensitive laminate costs about $1.00 per square foot. Also, the hardened polymer does not give longtime protection, because it tends to discolor with age and is easily scratched.

The TRANSFER-KEY system of 3M Company, uses a negative film rather than the positive color film of the DuPont system. In the TRANSFER-KEY system a color emulsion is laminated to proof stock, the negative film is laid over the photosensitive colored emulsion and exposed through ultraviolet light which hardens the photosensitive material in the image parts. After the negative is removed, the unexposed portion of the colored emulsion is washed off the stock leaving the colored image portion firmly adhered to the proof stock. This process is then repeated for each color in the proof. The final image then usually is a four-color image with no protection at all on the color hardened emulsions, which are susceptible to scratching and marring.

It has been proposed to apply a heat sensitive polyethylene or polyester sheet over the proof and heat fuse it to the surface of the proof. Although this is better and more inexpensive than the use of a photosensitive coating, it still is not completely satisfactory.

In the patent art, the patent to Fulwiler U.S. Pat. No. 4,077,830 dated Mar. 7, 1978 uses a pressure sensitive coated plastic sheet to protect movie film and to extend the life of the film. The protective film of Fulwiler has both surfaces finished to less than 10-millionths of an inch RSM on both sides and has a total thickness of less than 0.004 inches.

Another patent of some significance is King U.S. Pat. No. 3,697,277 issued Oct. 10, 1972. The King patent relates to a photographic print with a polyester coating adhered thereto. The polyester has a non-glare or matte surface. The composite wet photographic print-polyester film is heat treated at 190°–260° F. and dried to secure the matte surface to the image layer. Other patents of interest include Stone U.S. Pat. Nos. 3,397,980 and Sharp 3,519,423.

The present invention comprises a pre-press or pre-plate colored proof having a protective coating over the surface thereof supplied by a clear hard plastic sheet having a pressure sensitive backing thereon. The present invention further relates to processes for making said proofs.

DESCRIPTION OF THE DRAWINGS

In the drawings, where like numerals refer to like parts wherever they occur

DETAILED DESCRIPTION

Figure 1:
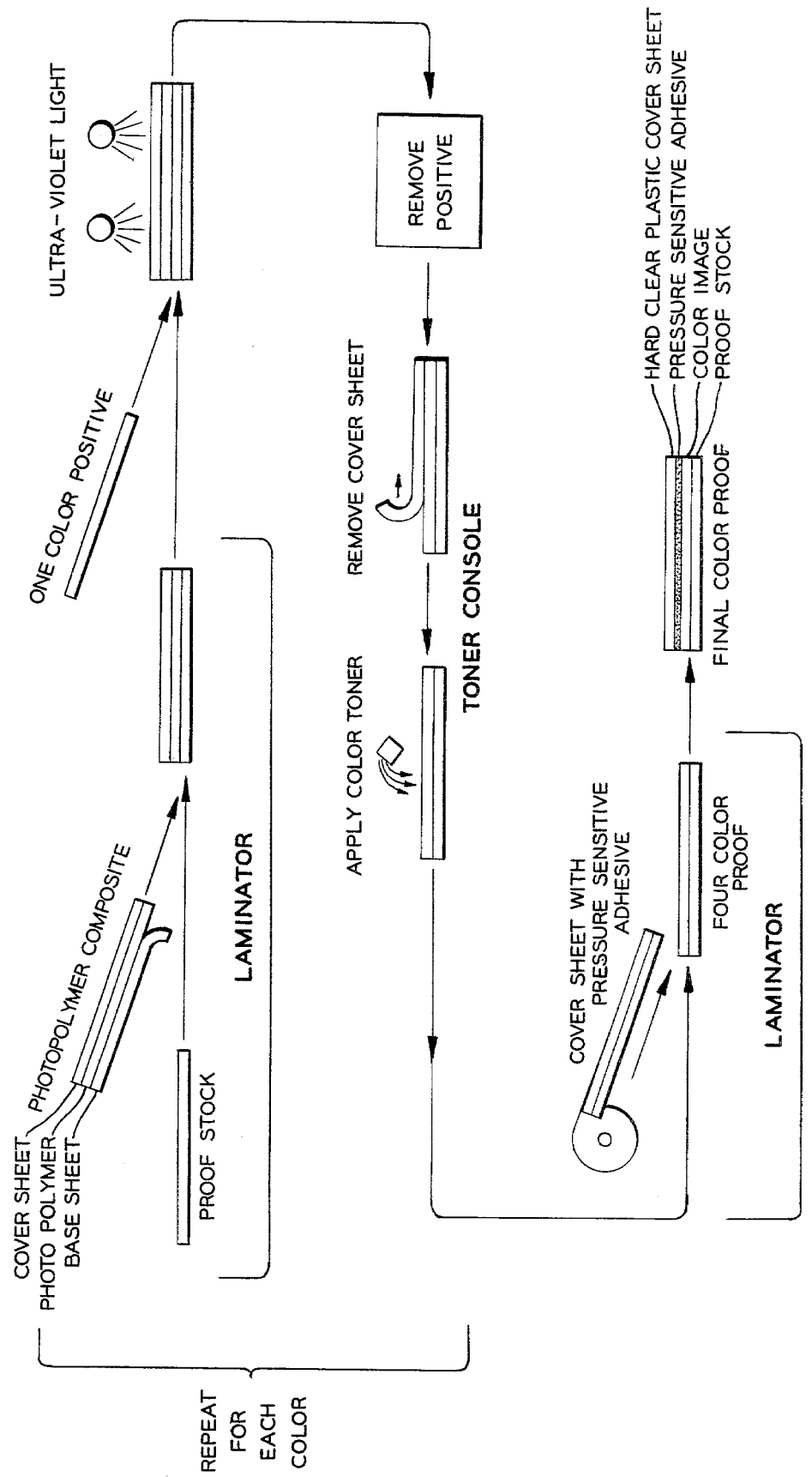
FIG. 1 is a schematic flow sheet of a form of the invention using clear photopolymer laminate.

The flow sheet of FIG. 1 shows a process of preparing the color pre-press or pre-plate proof using clear photopolymer laminates and at the end of the flow sheet is a composite final color proof.

In utilizing the process of this invention a sheet of proof stock or other suitable base or posterboard material is utilized. The proof stock may be any thickness the laminator is designed to accept and preferably is about 0.010–0.012" in thickness. The photopolymer material comprises a photopolymer sandwiched between a cover sheet and a base sheet. This photopolymer usually is supplied as as roll stock and in use is loaded into a laminator of conventional design which removes the base sheet and adheres the photopolymer and cover sheet to the proof stock.

A suitable photopolymer composite is CROMALIN from DuPont.

The next step in the process consists of applying a positive film having one color image thereon to the laminate and exposing the sensitized proof sheet to an ultraviolet light source through the film.

The light sensitive photopolymer layer is colorless and tacky as manufactured. The image on the film when exposed to the ultraviolet source causes the non-image areas of the photopolymer to selectively harden. These exposure hardened areas lose their tacky characteristic so that in a subsequent step the film accepts the color toner only in the unexposed image areas.

After the photopolymer has been exposed a sufficient length of time to harden the non-image areas, the film is removed and the composite is placed on a toner console where the cover sheet is peeled off and the appropriate dry color toner is applied. The tacky portions of the photopolymer accept the dry color toner so that a reproducible color similar to that which will be applied during the printing process is placed on the proof.

The foregoing procedure is repeated for each color to be found in the proof. In other words, a separate photopolymer composite is applied to the proof stock and a separate film is used for each color in the proof. Normally, in a four color process, the colors of the toner are yellow, magenta, cyan, and black.

The various color toners are matched to the color ink which is used in the subsequent printing process so that the pre-press or pre-plate proof gives a precise reproduction of the final product without the necessity of making plates or running a proof on the press.

The final and unique step in this process is the application of a hard clear plastic cover sheet to the four color proof and this is done in a laminator which applies a plastic film, such as Mylar, having a pressure sensitive adhesive onto the color surface of the proof to protect the colors from scratching, marring, smearing, etc.

Suitable plastic coatings are polyester, polyethylene, Mylar, etc. The cover sheet can be any reasonable thickness depending on the strength desired. The only constraint is that it must be optically clear. The preferred material is 0.001" thick polyester.

Figure 2:
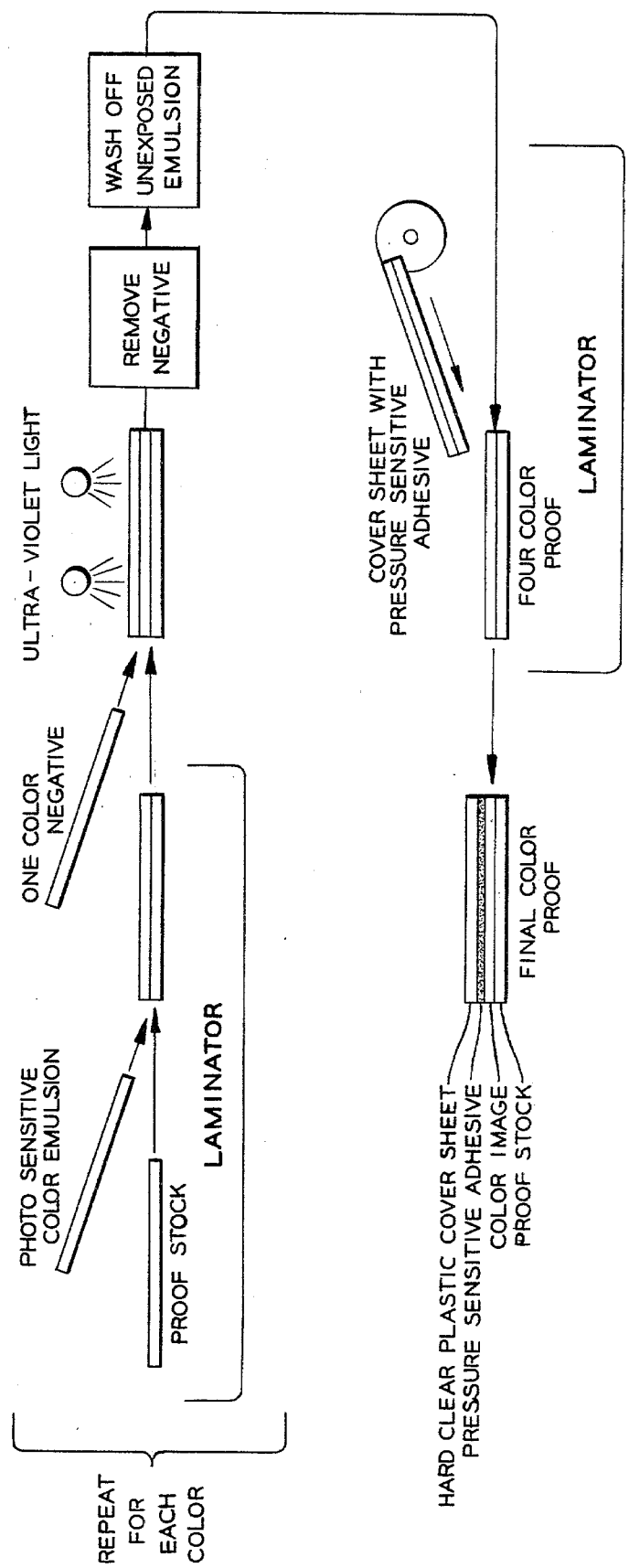
FIG. 2 is a schematic flow sheet of a form of the invention using colored photopolymer laminates.

FIG. 2 shows another form of the invention using photosensitive color emulsion laminated to the proof stock. In this form of the process, the photosensitive material is colored to match the printing inks and a negative image film is used so that when the photosensitive emulsion is exposed through the film to ultraviolet light, the image portion hardens and the laminator is washed away before the next colored emulsion is laminated to the proof stock. The final four-color proof then has the hard clear plastic cover applied in a laminator, so that the pressure sensitive adhesive adheres the plastic cover to the color image of the color proof to protect the surface thereof.

What is claimed is:

1. A process of preparing a pre-press proof comprising the steps of
    A. applying a photopolymer to a substrate,
    B. overlaying a one color separation film having an image thereon to the photopolymer,
    C. exposing the photopolymer through the film to harden selected portions of the photopolymer,
    D. removing the color separation film,
    E. treating the exposed photopolymer to produce the desired image thereon, and
    F. applying a hard clear polymer cover layer to the colored proof by means of a pressure sensitive adhesive backing.

2. The process of claim 1 wherein the photopolymer has a tacky surface and the color separation film is a positive so that the image portion of the film is not exposed, and wherein step E comprises applying a dry color to the unexposed tacky portion of the photopolymer prior to applying the hard clear polymer cover layer.

3. The process of claim 2 wherein steps A through E are repeated for each color in the final proof.

4. The process of claim 1 wherein the cover layer has a stripable material covering the pressure sensitive adhesive and including the step of stripping the said material prior to applying the cover to the substrate.

5. The process of claim 2 wherein the photopolymer has a clear cover layer and including the steps of positioning the film on the cover layer prior to exposure and exposing the film through the cover layer, and removing the cover layer prior to applying color to the unexposed part.

6. The process of claim 1 wherein the photopolymer is colored and the color separation film is a negative so that the image portion of the film is exposed and hardened and wherein the step E comprises removing the unexposed portion of the photopolymer prior to applying the hard clear polymer cover layer.

7. The process of claim 6 wherein steps A through E are repeated for each color in the final proof.

* * * * *